(12) United States Patent
Goguillon et al.

(10) Patent No.: US 8,125,213 B2
(45) Date of Patent: Feb. 28, 2012

(54) SYSTEM FOR EXTRACTION AND ANALYSIS OF SIGNIFICANT RADIOELECTRIC SIGNALS

(75) Inventors: Patrick Goguillon, Levallois Perret (FR); Philippe Viravau, Paris (FR); Bruno Cazeneuve, Yerres (FR); Dominique Lamelot, Clamart (FR); Thierry Lebourg, Eaubonne (FR)

(73) Assignee: Thales, Neuilly sur Seine (FR)

( * ) Notice: Subject to any disclaimer, the term of this patent is extended or adjusted under 35 U.S.C. 154(b) by 402 days.

(21) Appl. No.: 12/304,039

(22) PCT Filed: Jun. 6, 2007

(86) PCT No.: PCT/EP2007/055612
§ 371 (c)(1),
(2), (4) Date: Oct. 16, 2009

(87) PCT Pub. No.: WO2007/141311
PCT Pub. Date: Dec. 13, 2007

(65) Prior Publication Data
US 2010/0039098 A1    Feb. 18, 2010

(30) Foreign Application Priority Data
Jun. 9, 2006  (FR) ..................... 06 05142

(51) Int. Cl.
*G01R 23/16* (2006.01)

(52) U.S. Cl. ................ 324/76.22; 324/76.19; 324/76.29

(58) Field of Classification Search ................ 324/76.22
See application file for complete search history.

(56) References Cited

U.S. PATENT DOCUMENTS

| 5,748,507 | A | 5/1998 | Abatzoglou et al. |
| 6,359,429 | B1 * | 3/2002 | Arai et al. ............. 324/76.23 |
| 2009/0302829 | A1 * | 12/2009 | Kanoh et al. ............. 324/76.19 |

OTHER PUBLICATIONS

Novellino, et al, "Spectrum Analyzer Cover 2 MHz at Real-Time Speeds" Electronic Design, Penton Media, Cleveland, OH, US, vol. 36, No. 20, Sep. 8, 1988, pp. 121-123.
Romanchik, D, "DSP Boards Expedite Waveform Analysis" Electronics Test, Miller Freeman, San Francisco, US, vol. 10, No. 11, Oct. 1990, pp. 63-64, 66,68.
Zimmerman, et al: "A 640 MHz 32 megachannel real-time polyphase-FFT spectrum analyzer" Signals, Systems and Computers, 1991. 1991 Conference Record of the Twenty-Fifth Asilomar Conference on Pacific Grove, CA, USA Nov. 4-6, 1991, Los Alamitos, CA, USA, Nov. 4, 1991, pp. 106-110.

* cited by examiner

*Primary Examiner* — Thomas Valone
(74) *Attorney, Agent, or Firm* — Stroock & Stroock & Lavan LLP

(57) ABSTRACT

Embodiments of the invention relate to a system for extracting and analyzing radioelectric signals of interest. It includes an integer number N of channels. Each channel $V_i$ includes a receiver linked to an analog signals digital acquisition device delivering a digital signal $SN_i$. Each channel $V_i$ includes a bank of polyphase filters, extracting digital signals $SE_i$ from the digital signal $SN_i$. The digital signals $SE_i$ each have a smaller frequency bandwidth than that of the digital signal $SN_i$. The system includes at least one extracted digital signals distribution device suitable for receiving the digital signals $SE_i$ and distributing $SE_i$ to one or more processing and storage units. The processing and storage units are suitable for the analysis, characterization and storage of the digital signals received. Embodiments of the invention apply to the system for the radio-monitoring of radioelectric emissions in real time or in deferred time.

9 Claims, 1 Drawing Sheet

SYSTEM FOR EXTRACTION AND ANALYSIS OF SIGNIFICANT RADIOELECTRIC SIGNALS

CROSS REFERENCE TO RELATED APPLICATIONS

Figure 1:
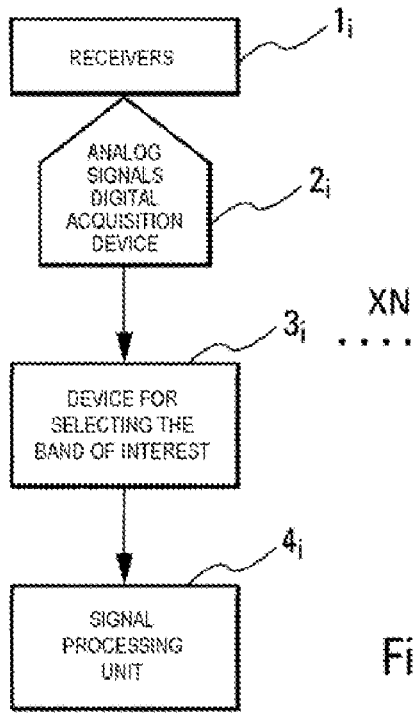

The present application is the U.S. National Phase of International Patent Application Serial No. PCT/EP2007/055612, filed on Jun. 6, 2007, which claims the benefit of French Patent Application Serial No. 0605142, both of which are hereby incorporated by reference in their entireties.

FIELD OF THE INVENTION

The invention relates to a system for extracting and analyzing radioelectric signals of interest, that is to say signals corresponding to one or more given uses of the spectrum. In particular, the invention applies to the system for the radio-monitoring of radioelectric emissions in real time, constrained time, or in deferred time.

BACKGROUND OF THE INVENTION

In the field of radiosurveillance of radio frequency ("RF") emissions, notably in the spectrum control applications, there exist systems whose architecture is suited to the processing in real time or in deferred time of signals of interest present in a broadband spectrum, that is to say lying between a few kilohertz and several hundred megahertz according to the frequency range observed. The object of these radiosurveillance systems is notably the analysis and the extraction of the information carried by all or part of the signals present in this spectrum, such as for example a frequency-modulated radio signal or else a mobile telephone signal. These radiosurveillance systems are designed to work over varied frequency ranges, for example HF, VHF, UHF and SHF.

Radiosurveillance systems comprise devices for acquiring radioelectric signals, transforming a radioelectric signal of analog nature into a digital signal. Accordingly, radiosurveillance systems use discrete components for analog digital conversion, possibly followed by digital components allowing band reduction and frequency transposition, designated by the expression "Digital Down Converter", allowing the extraction of a signal of interest in a broadband spectrum.

Radiosurveillance systems also comprise devices for processing and analyzing radioelectric signals making it possible to identify, extract and characterize the so-called signals of interest. For this purpose, radiosurveillance systems use detectors to reveal the presence of a radio-emission signal and digital computation means.

Radiosurveillance systems must cope with an increasingly varied and increasingly extensive range of use of the frequency spectrum. In particular, the architectures of the devices for processing and analyzing the radioelectric signals must be able to respond to the requirements of systematic processing, that is to say with no sensible loss of information, over an increasingly wide frequency band. Furthermore, radiosurveillance systems must be able to extract and process the narrowband signals distributed over these wide frequency bands.

Now, radiosurveillance systems using discrete components for frequency transposition and filtering are intrinsically limited by the bandwidth of the analog digital converters and by the number of discrete components implemented allowing parallel processing of only a fixed number of signals, defined by the hardware structure. Additionally, current techniques are highly dependent on the hardware resources available.

The aim of the invention is notably to alleviate the aforesaid drawbacks.

SUMMARY OF THE INVENTION

For this purpose, the subject of the invention is notably a system for extracting and analyzing radioelectric signals of interest comprising an integer number N of channels. Each channel $V_i$ includes a receiver linked to an analog signals digital acquisition device delivering a digital signal $SN_i$. Each channel $V_i$ includes a bank of polyphase filters, one or more extracted digital signals $SE_i$ being extracted by the bank of polyphase filters from the digital signal $SN_i$ emitted by the analog signals digital acquisition device. The extracted digital signals $SE_i$ each have a smaller frequency bandwidth than that of the digital signal $SN_i$ received from the analog signals digital acquisition device. The system includes at least one extracted digital signals distribution device suited to receiving the digital signals extracted $SE_i$ from the polyphase filter banks and distributing the digital signals extracted $SE_i$ from the polyphase filter banks to one or more processing and storage units. The processing and storage units are suitable for the analysis, characterization and storage of the digital signals received.

In an embodiment, the channels $V_i$ comprise a device for selecting the band of interest suitable for reducing the digital signal $SN_i$ delivered by an analog signals digital acquisition device to the frequency band of interest for said channel $(V_i)$. This band of interest may be composed of several disjoint sub-bands.

Each bank of polyphase filters can carry out systematic and continuous processing operations on the digital signal $SN_i$ output from the analog signals digital acquisition device.

Advantageously, the extracted digital signals distribution device chooses one of the processing and storage units to which a digital signal extracted $SE_i$ should be transmitted as a function of the functional specialization and/or of the availability of said processing and storage unit.

In another embodiment, the extracted digital signals distribution device selects extracted digital signals $SE_i$ and groups them together into packets before transmitting them to the processing and storage units, said packets being constructed as a function of the resources and of the physical media available.

Advantageously, the storage device included in the processing and storage units allows the data to be preserved in memory over a parametrizable duration and these data to be subsequently re-read depending on the requirements of the processing operations carried out in parallel.

In a particular embodiment, the polyphase filter banks and/or the extracted digital signals distribution device are included in one or more programmable-logic components. The extracted digital signals distribution device can furthermore be an IP switch.

The system can for example be used to convert the set of radioelectric signals into a data stream retransmitted on a digital network of Internet type or else to convert frequency division multiplexed signals into time division multiplexed signals. The system can also be used to implement processing operations relating to multi-antenna communication systems, and/or processing operations relating to high-resolution gononiometry.

Embodiments of the invention notably have the advantages that the number of channels that it makes it possible to process at a given instant is not limited by the hardware configuration of the embodiment, but solely by the bandwidth of the communication channels to the computation resources and the processing capability of these resources.

DETAILED DESCRIPTION OF THE DRAWINGS

Figure 2:
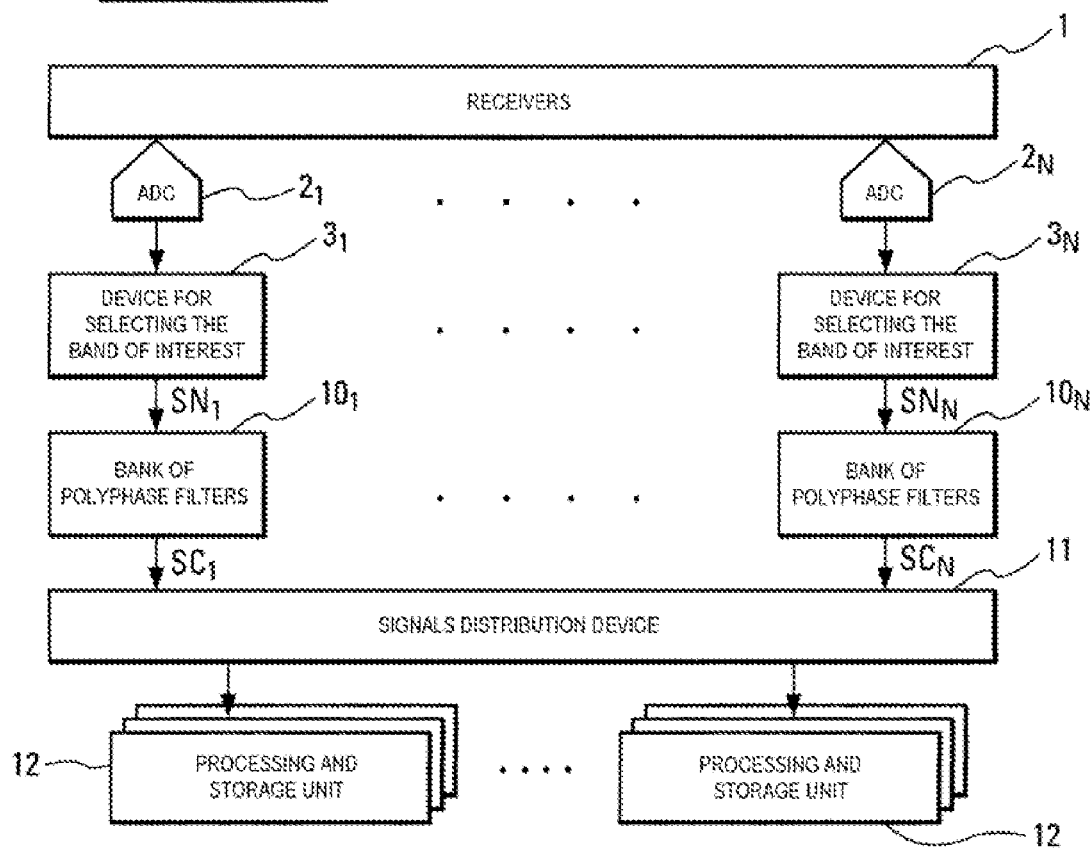

Other characteristics and advantages of the invention will become apparent with the aid of the description which follows, given with regard to the appended drawings which represent:

FIG. 1, a radiosurveillance system according to the state of the art;

FIG. 2, a schematic representing an exemplary architecture of a system according to an embodiment of the invention for extracting and analyzing radioelectric signals of interest over a broad frequency band, suitable notably for radiosurveillance.

DETAILED DESCRIPTION OF THE INVENTION

FIG. 1 represents a radiosurveillance system according to the state of the art. The object of a radiosurveillance system is to detect, extract and characterize the so-called signals of interest over a given geographical area. For this purpose, a radiosurveillance system includes a number n of receivers $1_1 \ldots 1_n$ making it possible to receive in analog form a signal representative of the radioelectric environment of the radiosurveillance system. These receivers $1_1 \ldots 1_n$ are typically antennas or more generally antenna arrays coupled to a frequency transposition and filtering stage. The radiosurveillance system according to the state of the art can comprise an integer number N of channels, the number n of receivers $1_1 \ldots 1_n$ being equal to N.

Thus to each channel $V_i$, i being an integer included in the interval [1 ... N], there corresponds the receiver $1_i$, an analog signals digital acquisition device $2_i$, a device for selecting the band of interest $3_i$ and a signal processing unit $4_i$. Each receiver $1_i$ delivers an analog signal $SA_i$. This analog signal $SA_i$ is then converted into a digital signal, by the analog signals digital acquisition device $2_i$. In particular, the analog signals digital acquisition device $2_i$ includes for example components of analog digital converter type for this purpose. The digital signal arising from the analog signals digital acquisition device $2_i$ is for example a digital signal whose frequency band B is chosen as a function of the characteristics of the receiver $1_i$ and of the analog digital converter $2_i$. So, this digital signal may be limited by the device for selecting the band of interest $3_i$ to a digital signal corresponding to a frequency band of interest BI that is more reduced than the frequency band B (BI<B), suited to the requirements and/or to the computational capabilities of the radiosurveillance system. This frequency band BI of interest can be split into a set of x narrower bands of identical width to the signals of interest. The device for selecting the band of interest includes a number x of discrete digital components for frequency transposition and filtering. This number x is fixed and defined by the hardware structure. The x digital signals limited to the frequency band of interest are thereafter transmitted to the signal processing unit $4_i$ which will detect, analyze and characterize the elements present in the x transmitted digital signals so as to highlight the relevant elements.

Each channel $V_i$ is dedicated to the analysis of a given frequency band of the electromagnetic environment. Each of the N channels $V_i$ can be dedicated to a different band of interest for each channel $V_i$, or conversely several channels $V_i$ can be coupled, that is to say made coherent, so as to allow multi-channel processing operations like conventional or high resolution radiogoniometry, spatial filtering, separation of sources. The analysis capabilities of the radiosurveillance system are therefore intrinsically limited by the bandwidth of the analog digital converters of the analog signals digital acquisition device $2_i$ and by the number x of discrete components implemented by the device for selecting the band of interest $3_i$ for a given channel $V_i$. The radiosurveillance system according to the state of the art therefore allows parallel processing of only a fixed number of signals of interest, i.e. N X x, defined by the hardware structure of each channel $V_i$ and of the number N of channels. From this it follows furthermore that the radiosurveillance system according to the state of the art is highly dependent on the hardware resources available, at the level of the devices $2_i$, $3_i$ and $4_i$.

FIG. 2 illustrates an exemplary architecture of a system, according to an embodiment of the invention, for extracting and analyzing radioelectric signals of interest over a broad frequency band, suitable notably for radiosurveillance. The elements identical to the elements already presented in the other figures bear the same references. The system according to an embodiment of the invention for extracting and analyzing radioelectric signals of interest includes an integer number N of channels, each channel $V_i$ (i being an integer included in the interval [1 ... N]) comprising a receiver $1_i$, an analog signals digital acquisition device $2_i$ for a band B, and a device for selecting the band of interest BI $3_i$ suitable for reducing the is digital signal delivered by an analog signals digital acquisition device $2_i$ to the frequency band of interest for said channel $V_i$. This band of interest BI may be composed of several disjoint sub-bands. Each channel $V_i$ furthermore includes a bank of polyphase filters $10_i$. The signal received by the bank of polyphase filters is a digital signal $SN_i$ of wide frequency band BI, possibly composed of several sub-bands. The bank of polyphase filters $10_i$ carries out systematic and continuous processing operations on the digital signal $SN_i$ output from the device for selecting the band of interest BI $3_i$. The bank of polyphase filters $10_i$ performs continuous processing operations on the whole of the frequency band of interest. The bank of polyphase filters $10_i$ makes it possible notably to split the digital signal $SN_i$ corresponding to the band of interest BI into an integer number p of coherent extracted digital signals $SE_i$ whose frequency band b is reduced, in relation to the digital signal $SN_i$ input to the bank of polyphase filters $10_i$ such that the following relation is satisfied:

$$BI = p \times b.$$

Depending on the configuration of the bank of polyphase filters $10_i$, it is possible to reconstitute all or part of the original broadband signal with a controlled degradation dependent chiefly on the parameters of the polyphase filter bank $10_i$. The switchover of the digital signal $SN_i$ received by the bank of polyphase filters $10_i$ to several extracted digital signals $SE_i$ is dimensioned so that the degradation does not impact the processing operations implemented downstream.

In an embodiment, the bank of polyphase filters $10_i$ includes one or more programmable-logic components of FPGA or ASIC type in the case of real-time systems notably, or on general-purpose processors in the case of constrained time or deferred time processing operations.

The system includes an extracted digital signals distribution device 11, taking into account the N channels of the system. The digital signals extracted $SE_i$ at the level of the polyphase filter banks $10_i$ are thereafter transmitted to the extracted digital signals distribution device 11. Depending on the requirement and the end application, the extracted digital signals distribution device 11 is programmed to select and distribute the extracted digital signals $SE_i$ of interest to the processing and storage units 12. The extracted digital signals distribution device 11 therefore chooses one of the processing and storage units 12 to which one of the extracted digital signals $SE_i$ should be transmitted as a function of the functional specialization and/or of the availability of said processing and storage unit 12. Thus, if a processing and storage unit 12 no longer has sufficient resources (computational or storage for example), the extracted digital signals distribution device 11 can be reconfigured to allocate the processing operations to other units having the necessary resources. The extracted digital signals distribution device 11 can furthermore group together the extracted digital signals $SE_i$ into packets before transmitting them so as to optimize the bandwidth and the occupancy rate of the link connecting it to the processing and storage units 12.

The processing and storage units 12 are for example be conventional computers, of personal computer type (PC), so as notably to optimize the cost/performance ratio of the solution in comparison notably with dedicated machines for signal processing (or Digital Signal Processors). These extracted digital signals $SE_i$, narrower than the digital signal entering the bank of polyphase filters $10_i$, can then be processed in parallel by processing and storage units 12, which can be ordinary computation resources.

By way of nonlimiting example, the processing and storage units 12 can perform at least one of the signal processing tasks, on one or more radioelectric signals, for emission detection, segmentation, modulation recognition, waveform identification, goniometry, location, beam forming, demodulation of fixed-frequency emissions, demodulation of time division and frequency division multiplexed emissions, technical measurements of "UIT" type, buffering of the signal over a parametrizable duration, recording of narrowband and/or broadband signals, etc.

The extracted digital signals distribution device 11 distributes via communication channels the extracted digital signals $SE_i$ output from the bank of polyphase filters $10_i$ on processing units as a function of the application envisaged. Thus, depending on the communication media, the physical location of the various processing and storages units 11 is therefore not necessarily unique. The processing and storage units 12 can therefore be distributed in several distinct geographical areas, separated according to requirements by a few tens of meters to several thousand kilometers. The extracted digital signals distribution device 11 further makes it possible to dissociate the processing and storage units 12 from the other elements included in the system according to an embodiment of the invention for extracting and analyzing radioelectric signals of interest over a broad frequency band. Thus, the processing and storage units 12 can be physically separated from the other elements of the system.

Additionally, the extracted digital signals distribution device 11 is common to the set of N channels included in the system according to an embodiment of the invention. It therefore makes it possible to mutualize the computation and storage resources available between the set of channels, and thus improve notably the availability of the system. The system also makes it possible to adapt the processing resources to suit the number of emissions of interest. Thus, depending on requirements it is very easy to append a new ordinary processing and storage unit 12 if the operational requirements justify it.

The extracted digital signals distribution device 11 can be implemented with the aid of IP switches (or "Ethernet switches" as they are known) or in one or more programmable-logic components of FPGA or ASIC type notably, possibly in the same programmable logic component as the bank of polyphase filters 10.

The system according to an embodiment of the invention uses banks of polyphase filters $10_i$ splitting a signal distributed over a broad frequency band into a number p of signals of narrower frequency band. Depending on the configuration of the distribution device 11, the processing and storage units 11 can therefore reconstitute all or part of the original signal with broad frequency band with a controlled degradation dependent on the parameters of the filter bank $10_i$. Moreover, the processing and storage units 11 by combining the signals of narrower frequency band of the set of filter banks $10_i$ of a set of the K channels, with $K \leq N$, of the system can reconstitute a wide-band signal whose bandwidth is K times larger than the bandwidth of interest BI processed by a single filter bank $10_i$.

The system according to an embodiment of the invention is notably suitable for selecting narrowband signals as a function of their interest, for broadcasting signals in packets on processing and storage resources, for processing in the stream the packets of signals received by the processing resources, for accessing the storage area or the buffer memory so as to extract previously stored signals, for regenerating all or part of the broadband signal on the basis of these narrowband signals, and for executing signal processing operations on these regenerated data.

The system according to an embodiment of the invention can be used to control the allocations of frequency band to an operator by a spectrum control body. The system according to an embodiment of the invention can also be implemented in order to convert the set of radio signals into a data stream retransmitted for example on a network of Internet type. The system according to an embodiment of the invention can further be used to convert frequency division multiplexed (or Frequency-Division Multiple Access as it is known) signals into time division multiplexed (or Time-Division Multiple Access as it is known) signals. The system according to an embodiment of the invention can also be used for the implementation of processing operations relating to multi-antenna (or Multi-Input Multiple-Output as it is known) communication systems, or else within the framework of processing operations for high-resolution gononiometry.

The invention claimed is:

1. A system for extracting and analyzing radioelectric signals of interest from an RF signal, comprising:
   a plurality of channels, each channel comprising:
      a receiver to receive the RF signal;
      an analog to digital acquisition device linked to the receiver, to produce a digital signal $SN_i$; and
      a bank of polyphase filters in communication with the analog to digital acquisition device, to extract digital signals $SE_i$ from the digital signal $SN_i$, said digital signals $SE_i$ each having a smaller frequency bandwidth than that of the digital signal $SN_i$;
   at least one extracted digital signals distribution device adapted to receive the digital signals $SE_i$ extracted from the polyphase filter banks, and adapted to distribute the digital signals $SE_i$ to one or more processing and storage units, said processing and storage units usable for analysis, characterization and storage of the digital signals $SE_i$.

2. The system as claimed in claim 1 wherein each channel of at least a portion of the plurality of channels further comprises a device for selecting a band of interest suitable for reducing the digital signal $SN_i$ to the frequency band of interest for said channel.

3. The system as claimed in claim 1 wherein the bank of polyphase filters carries out systematic and continuous processing operations on the digital signal $SN_i$.

4. The system as claimed in claim 1 wherein the extracted digital signals distribution device chooses the processing and storage unit to receive the digital signal $SE_i$ based on the functional specialization and/or of the availability of said processing and storage unit.

5. The system as claimed in claim 1 wherein the extracted digital signals distribution device selects one or more digital signals $SE_i$ and groups them together into one or more packets before transmitting them to the processing and storage units, said packets being constructed as a function of resources and of physical media available.

6. The system as claimed in claim 1 wherein a storage device included in the processing and storage units allows data to be preserved in memory over a parametrizable duration and allows the data to be subsequently re-read depending on requirements of processing operations carried out in parallel.

7. The system as claimed in claim 1 wherein the polyphase filter banks and/or the extracted digital signals distribution device are included in one or more programmable-logic components.

8. The system as claimed in claim 1 wherein the extracted digital signals distribution device includes an IP switch.

9. The system as claimed in claim 2 wherein the frequency band of interest for the channel comprises several disjoint sub-bands.

\* \* \* \* \*